United States Patent
Asakura

(10) Patent No.: US 10,619,611 B2
(45) Date of Patent: Apr. 14, 2020

(54) LAMINATED PIEZOELECTRIC ELEMENT, AND INJECTION DEVICE AND FUEL INJECTION SYSTEM PROVIDED WITH SAME

(71) Applicant: KYOCERA Corporation, Kyoto-shi, Kyoto (JP)

(72) Inventor: Yasuhiro Asakura, Kirishima (JP)

(73) Assignee: KYOCERA CORPORATION, Kyoto (JP)

(*) Notice: Subject to any disclaimer, the term of this patent is extended or adjusted under 35 U.S.C. 154(b) by 380 days.

(21) Appl. No.: 15/542,790

(22) PCT Filed: Dec. 24, 2015

(86) PCT No.: PCT/JP2015/085968
§ 371 (c)(1),
(2) Date: Jul. 11, 2017

(87) PCT Pub. No.: WO2016/121278
PCT Pub. Date: Aug. 4, 2016

(65) Prior Publication Data
US 2018/0003137 A1    Jan. 4, 2018

(30) Foreign Application Priority Data

Jan. 28, 2015 (JP) ................ 2015-014438

(51) Int. Cl.
*H01L 41/083* (2006.01)
*F02M 51/06* (2006.01)
(Continued)

(52) U.S. Cl.
CPC ........ *F02M 51/06* (2013.01); *F02M 63/0026* (2013.01); *H01L 41/0533* (2013.01);
(Continued)

(58) Field of Classification Search
CPC ... H01L 41/09; H01L 41/083; F02M 63/0026; F02M 51/06; H02N 2/001
See application file for complete search history.

(56) References Cited

U.S. PATENT DOCUMENTS

2002/0084723 A1* 7/2002 Kawazoe ............ F02M 47/027
310/348
2002/0163282 A1  11/2002 Heinz
(Continued)

FOREIGN PATENT DOCUMENTS

DE    102007037550 A1    2/2009
EP       2079115 A2       7/2009
(Continued)

OTHER PUBLICATIONS

International Search Report, PCT/JP2015/085968, dated Apr. 5, 2016, 2 pgs.

*Primary Examiner* — J. San Martin
(74) *Attorney, Agent, or Firm* — Volpe and Koenig, P.C.

(57) ABSTRACT

There are provided a laminated piezoelectric element in which a stress applied to an interface between a cover layer and a stacked body is reduced, and an injection device and a fuel injection system provided with the laminated piezoelectric element. A laminated piezoelectric element includes a stacked body in which piezoelectric layers and internal electrode layers are alternately laminated; and a cover layer disposed so as to surround a side face of the stacked body, and the cover layer has a two-layer structure with an annular boundary when viewed in a section perpendicular to a stacking direction of the stacked body.

8 Claims, 6 Drawing Sheets

(51) Int. Cl.
*H01L 41/053* (2006.01)
*H01L 41/09* (2006.01)
*H01L 41/23* (2013.01)
*F02M 63/00* (2006.01)
*H02N 2/00* (2006.01)

(52) U.S. Cl.
CPC ............ *H01L 41/083* (2013.01); *H01L 41/09* (2013.01); *H01L 41/23* (2013.01); *F02M 51/0603* (2013.01); *H02N 2/001* (2013.01)

(56) References Cited

U.S. PATENT DOCUMENTS

| | | |
|---|---|---|
| 2007/0257581 A1 | 11/2007 | Buma |
| 2009/0096324 A1* | 4/2009 | Kronberger ........ F02M 51/0603 310/328 |
| 2010/0163650 A1 | 7/2010 | Heinz et al. |
| 2010/0282874 A1* | 11/2010 | Nakamura .......... H01L 41/0471 239/585.1 |

FOREIGN PATENT DOCUMENTS

| | | |
|---|---|---|
| JP | 2001-036157 A | 2/2001 |
| JP | 2004-296585 A | 10/2004 |
| JP | 2007-281256 A | 10/2007 |
| JP | 2008-300466 A | 12/2008 |
| JP | 2010-506412 A | 2/2010 |

\* cited by examiner

LAMINATED PIEZOELECTRIC ELEMENT, AND INJECTION DEVICE AND FUEL INJECTION SYSTEM PROVIDED WITH SAME

TECHNICAL FIELD

The present invention relates to a laminated piezoelectric element which is used as, for example, a piezoelectric driving element (piezoelectric actuator) or a pressure sensor element, and an injection device and a fuel injection system provided with the same.

BACKGROUND ART

There is a heretofore known laminated piezoelectric element comprising: a stacked body including an active section in which piezoelectric layers and internal electrode layers are laminated, and inactive sections disposed at opposite ends of the active section in a stacking direction; an external electrode layer disposed on a side face of the stacked body so as to extend from the active section to each of the inactive sections; and a cover layer disposed so as to cover the side face of the stacked body (refer to Patent Literature 1, for example).

CITATION LIST

Patent Literature

Patent Literature 1: Japanese Unexamined Patent Publication JP-A 2004-296585

SUMMARY OF INVENTION

Technical Problem

For example, the laminated piezoelectric element described above is used in a state where a side face thereof (a surface of the cover layer) is secured to an apparatus, but, when the laminated piezoelectric element is driven under such a condition for a long period of time, while the stacked body expands and contracts, the cover layer undergoes neither expansion nor contraction, or, if any, the stacked body expands and contracts slightly so as to follow the expanding and contracting movement of the stacked body, and, a stress is then applied to an interface between the cover layer and the stacked body. Consequently, a crack is developed at the interface between the cover layer and the stacked body, which results in the end of the internal electrode layer being exposed, and the ensuing electrical discharge may lead to a decrease in the amount of displacement in the laminated piezoelectric element.

Furthermore, the need for a laminated piezoelectric element in which stress loads to the interface between the cover layer and the stacked body can be lightened is arising from a demand for a laminated piezoelectric element which is greater in displacement amount than ever.

The invention has been devised in view of the circumstances as discussed supra, and accordingly an object of the invention is to provide a laminated piezoelectric element capable of reduction in stress applied to the interface between the cover layer and the stacked body, and an injection device and a fuel injection system provided with the same.

Solution to Problem

A laminated piezoelectric element according to the invention comprises: a stacked body in which piezoelectric layers and internal electrode layers are alternately laminated; and a cover layer disposed so as to surround a side face of the stacked body, the cover layer having a two-layer structure with an annular boundary when viewed in a section perpendicular to a stacking direction of the stacked body.

Moreover, an injection device according to the invention comprises: a container provided with an injection hole; and the laminated piezoelectric element described above, the injection hole being opened and closed by driving the laminated piezoelectric element.

Moreover, a fuel injection system according to the invention comprises: a common rail configured to store a high-pressure fuel; the injection device mentioned above, the injection device being configured to inject the high-pressure fuel stored in the common rail; a pressure pump configured to supply the high-pressure fuel to the common rail; and an injection control unit configured to send a driving signal to the injection device.

Advantageous Effects of Invention

In the laminated piezoelectric element according to the invention, the amount of displacement can be maintained constant for a long period of time by virtue of a reduction in stress applied to the interface between the cover layer and the stacked body.

Moreover, the injection device and the fuel injection system provided with the laminated piezoelectric element mentioned above can be driven stably for a long period of time with excellent durability by virtue of long-term displacement stability in the laminated piezoelectric element.

DESCRIPTION OF EMBODIMENTS

Hereinafter, a laminated piezoelectric element in accordance with one embodiment of the invention will be described with reference to drawings.

Figure 1A:
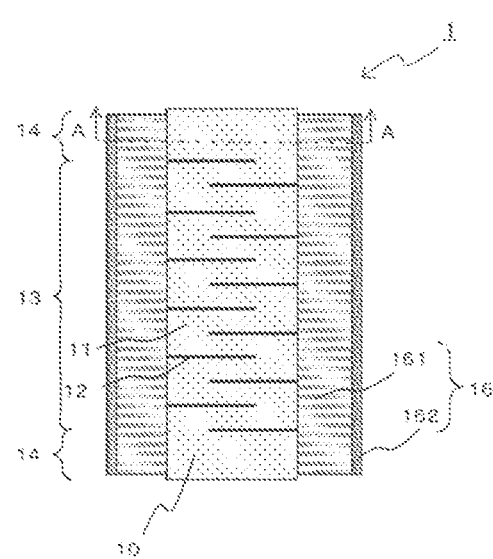
FIG. 1A is a schematic longitudinal sectional view showing a laminated piezoelectric element in accordance with one embodiment of the invention.
Figure 1B:
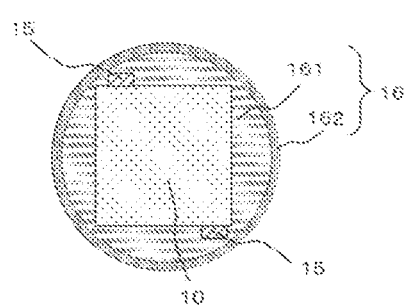
FIG. 1B is a view showing an example of a transverse section of the laminated piezoelectric element taken along the line A-A shown in FIG. 1A.

FIG. 1A is a schematic longitudinal sectional view showing a laminated piezoelectric element in accordance with one embodiment of the invention, and FIG. 1B is a view showing an example of a transverse section of the laminated piezoelectric element taken along the line A-A shown in FIG. 1A.

A laminated piezoelectric element 1 as shown in FIGS. 1A and 1B comprises: a stacked body 10 in which piezoelectric layers and internal electrode layers 12 are alternately laminated; and a cover layer 16 disposed so as to surround a side face of the stacked body 10, and, the cover layer 16 has a two-layer structure with an annular boundary when viewed in a section perpendicular to a stacking direction of the stacked body 10.

The stacked body 10 constituting the laminated piezoelectric element 1 comprises: an active section 13 composed of a stack in which piezoelectric layers 11 and internal electrode layers 12 are alternately laminated; and inactive sections 14 which are each made of a piezoelectric layer 11 and are disposed at opposite ends in the stacking direction of the stacked body 1 which opposite ends lie on an outside of the active section 13. For example, the stacked body 10 is shaped in a rectangular parallelepiped which is 0.5 to 10 mm in length, 0.5 to 10 mm in width, and 1 to 100 mm in height. While the stacked body 10 in which the piezoelectric layers 11 and internal electrode layers 12 are alternately laminated means the stacked body including the active section 13 in which the stacked piezoelectric layers 11 and internal electrode layers 12 are alternately laminated, it shall not preclude the construction as described above having the inactive sections 14 disposed at opposite ends of the active section in the stacking direction.

The piezoelectric layer 11 constituting the stacked body 10 is made of ceramics having piezoelectric properties, and, as such a ceramics, for example, a perovskite oxide composed of lead zirconate titanate ($PbZrO_3$—$PbTiO_3$), lithium niobate ($LiNbO_3$), and lithium tantalate ($LiTaO_3$) can be used. The piezoelectric layer 11 has a thickness of 3 μm to 250 μm, for example.

The internal electrode layer 12 constituting the stacked body 10 is formed by co-firing with ceramics for forming the piezoelectric layer 11, and, the internal electrode layers 12 and the piezoelectric layers 11 are alternately laminated so that the piezoelectric layer 11 is vertically interposed between the internal electrode layers 12, and more specifically, the internal electrode layer of positive polarity and the internal electrode layer of negative polarity are arranged in the stacking order for application of a driving voltage to the piezoelectric layer 11 interposed between these layers. As the material of construction of the internal electrode layer 12, for example, a conductor composed predominantly of a silver-palladium alloy which lends itself to low-temperature firing, or a conductor containing copper, platinum or the like, can be used. In the embodiment shown in FIGS. 1A and 1B, the positive electrodes and the negative electrodes (or grounding electrodes) are alternately led out to the corresponding paired opposite side faces of the stacked body 10 in a staggered configuration for electrical connection with corresponding paired external electrode layers 15 disposed on respective side faces of the stacked body 10. The internal electrode layer 12 has a thickness of 0.1 μm to 5 μm, for example.

The external electrode layers 15 are disposed on the opposite side faces, respectively, of the stacked body 10 so as to extend from the active section 13 to the inactive section 14. The paired external electrode layers 15 are preferably made of an electrically conductive paste containing metal such for example as Ag or Cu. For example, the external electrode layer 15 is formed in thickness of 5 to 70 μm when viewed in a transverse section perpendicular to the side face of the stacked body 10.

Although not illustrated in the drawings, a lead member is joined to an end of the external electrode layer 15, and, the lead member is led out to permit electrical connection with an external circuit.

Moreover, the cover layer 16 is disposed so as to surround the side face of the stacked body 10. The cover layer 16 is intended to cover the end of the internal electrode layer 12 for prevention of exposure of the end thereof for the purpose of reducing migration or electrical discharge arising through the end of the internal electrode layer 12 extending to the side face of the stacked body 10, and thus the cover layer 16 covers the side face of the stacked body 10 and the external electrode layer 15 as well.

The cover layer 16 has a two-layer structure composed of an inner first layer 161 and an outer second layer 162. In the illustrated embodiment, the cover layer 16 takes the form of a two-layer structural body. The first layer 161 is made of a silicone resin or an epoxy resin, for example, and, the second layer 162 is made of a silicone resin or a nylon resin, for example. By virtue of the cover layer 16 having a two-layer structure, a stress applied to the interface between the cover layer 16 and the stacked body 10 can be distributed between the layers constituting the cover layer 16, with consequent stress reduction.

When viewed in a section perpendicular to the stacking direction of the stacked body 10, the cover layer 16 has a two-layer structure in which the boundary of the inner first layer 161 and the outer second layer 162 is defined by an annular shape. That is, when viewed in the section perpendicular to the stacking direction of the stacked body 10, it will be seen that the outer periphery of the inner first layer 161 is defined by an annular shape. Thereby, when the laminated piezoelectric element 1 is used in a state where a side face thereof (the surface of the cover layer 16) is secured to an apparatus, since the boundary of the first layer 161 and the second layer 162 is free from stress concentration, it follows that a stress can be distributed evenly between the layers constituting the cover layer 16, and also, the cover layer 16 smoothly follows the expanding and contracting movement of the stacked body 10 in the stacking direction, with consequent further reduction of the stress applied to the interface between the cover layer 16 and the stacked body 10. This makes it possible to avoid that cracking occurs at the interface between the cover layer 16 and the stacked body 10, which results in the end of the internal electrode layer 12 being exposed so as to cause electrical discharge, and thereby implement a highly durable laminated piezoelectric element 1 in which the amount of displacement can be maintained constant for a long period of time.

It is preferable that an air gap is present at the annular boundary. The presence of an air gap at the annular boundary allows stress distribution or stress relaxation, thus achieving further reduction of the stress applied to the interface between the cover layer 16 and the stacked body 10. As employed herein, the term "air gap" may be taken to mean those ranging from a pore (a void as well, which will hereafter be described) bordering the boundary to a large cavity extending along the boundary.

Figure 2A:
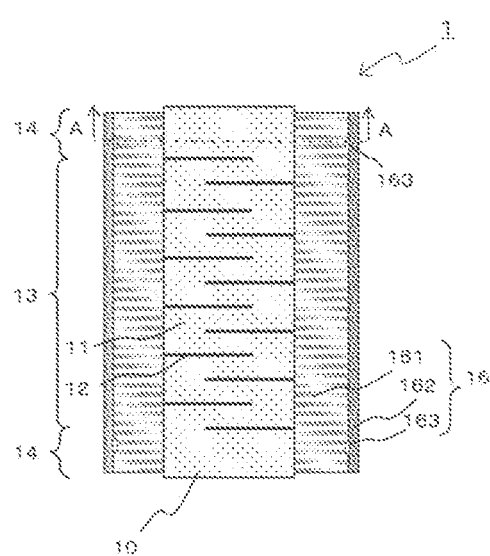
FIG. 2A is a schematic longitudinal sectional view showing another example of the laminated piezoelectric element in accordance with one embodiment of the invention.
Figure 2B:
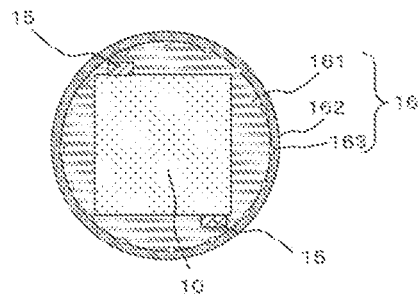
FIG. 2B is a view showing an example of a transverse section of the laminated piezoelectric element taken along the line A-A shown in FIG. 2A.
Figure 3A:
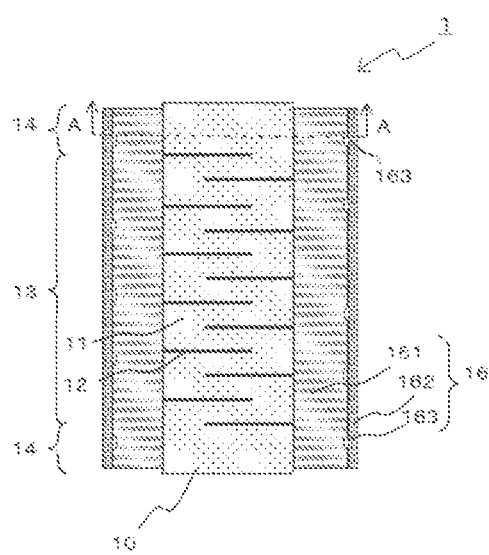
FIG. 3A is a schematic longitudinal sectional view showing another example of the laminated piezoelectric element in accordance with one embodiment of the invention.
Figure 3B:
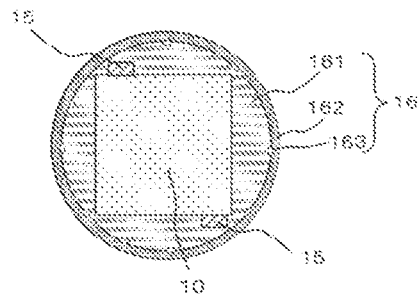
FIG. 3B is a view showing an example of a transverse section of the laminated piezoelectric element taken along the line A-A shown in FIG. 3A.

For example, as shown in FIGS. 2A and 2B, a plurality of air gaps 163 are scattered along the annular boundary in the cover layer 16 located on the side of the inactive section 14, and, these air gaps 163 are dispersed in a circumferential direction, wherefore the stress applied to the interface between the cover layer 16 and the stacked body 10 can be effectively reduced throughout in the circumferential direction. Moreover, as shown in FIGS. 3A and 3B, the air gaps 163 are dispersed in the stacking direction, wherefore the stress applied to the interface between the cover layer 16 and the stacked body 10 can be effectively reduced throughout in the stacking direction.

The air gap 163 is preferably shaped so as to lie flat along the plane of the interface between the cover layer 16 and the stacked body 10, or may be given the form of connected rows of a plurality of air gaps. For example, the size of the air gap is preferably greater than or equal to one-thousandth the longitudinal length or circumferential length of the boundary but less than or equal to one-tenth that length.

Figure 4A:
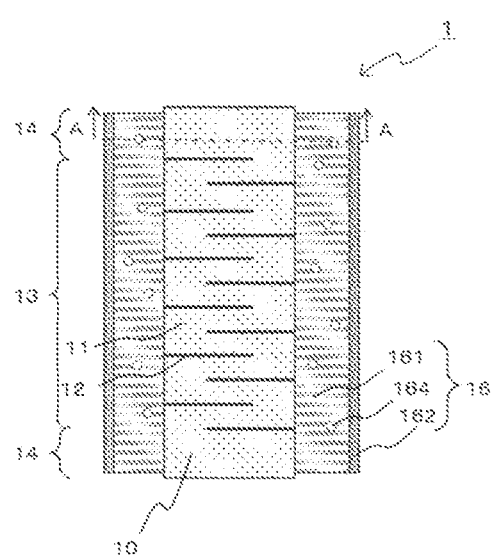
FIG. 4A is a schematic longitudinal sectional view showing another example of the laminated piezoelectric element in accordance with one embodiment of the invention.
Figure 4B:
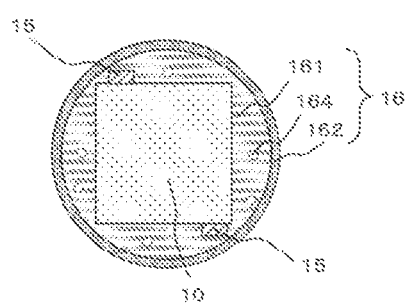
FIG. 4B is a view showing an example of a transverse section of the laminated piezoelectric element taken along the line A-A shown in FIG. 4A.

Moreover, as shown in FIGS. 4A and 4B, it is preferable that the two-layer structure is composed of an inner first layer 161 having an annular outer periphery and an outer second layer 162 having an annular inner periphery, and that voids 164 are present within the first layer 161. As employed herein, the term "voids 164" refers to a plurality of interstices scattered in the interior of the first layer 161 or a plurality of interstices that are, at least partly, connected with each other within the layer. The presence of the voids within the first layer 161 having an annular outer periphery, viz., the inner first layer 161 enables the first layer 161 to follow the expanding and contracting movement of the stacked body 10 smoothly, with consequent further reduction of the stress applied to the interface between the cover layer 16 and the stacked body 10. When viewed in a section, the diameter of the void 164 which is spherical in shape, or the dimension of the void 164 having an other-than-spherical form in terms of equivalent circle diameter, falls in a range of 100 μm to 200 μm, for example. Moreover, the area ratio of the voids to a given section of the first layer 161 is preferably greater than or equal to 1% but less than or equal to 5%.

Moreover, when the two-layer structure is composed of an inner first layer 161 having an annular outer periphery and an outer second layer 162 having an annular inner periphery, and the first layer 161 is smaller in elastic modulus than the second layer 162, then the first layer 161 undergoes distortion to a greater extent than does the second layer 162, and is thus allowed to follow the expanding and contracting movement of the stacked body 10 more smoothly, wherefore the stress applied to the interface between the cover layer 16 and the stacked body 10 can be reduced even further.

For example, such a construction may be obtained by, where the first layer 161 and the second layer 162 are made of different materials, placing the laminated piezoelectric element 1 inside a nylon resin-made cylindrical body serving as the outer second layer 162 having an annular inner periphery, pouring a silicone resin in liquid form into the gap between the laminated piezoelectric element and the second layer, and curing the silicone resin to form the inner first layer 161. Moreover, the construction may also be obtained by placing the laminated piezoelectric element 1 inside a silicone resin-made cylindrical body serving as the outer second layer 162 having an annular inner periphery, pouring a silicone resin in liquid form into the gap between the laminated piezoelectric element and the second layer, and forming the inner first layer 161 by curing the silicone resin at a temperature lower than the curing temperature set for the formation of the cylindrical body which constitutes the second layer 162.

On the other hand, also in a case where the first layer 161 is greater in elastic modulus than the second layer 162, since the second layer 162 undergoes distortion to a greater extent than does the first layer 161, it is possible to distribute the stress at the interface between the first layer 161 and the second layer 162. For example, such a construction may be obtained by applying an inorganic material such as ceramics or glass onto the side of the stacked body 10 as a coating whose outer surface has an annular sectional profile to form the first layer 161 having an annular outer periphery, printing or applying a material which is smaller in elastic modulus than the coating, such as a silicone resin, onto the coating, and curing the silicone resin to form the second layer 162.

As described above, the first layer 161 or the second layer 162 is preferably made of resin, and, by forming at least one of these layers from resin, it is possible to achieve effective distribution of the stress at the interface between the cover layer 16 and the stacked body 10, as well as to produce the described construction with ease at lower costs.

Moreover, in the laminated piezoelectric element 1 shown in FIGS. 1 to 4 as viewed in a section perpendicular to the stacking direction of the stacked body 10, the outer periphery of the outer second layer 162 is defined by an annular shape, and, designing the outer second layer 162 to have such an annular outer periphery is desirable from the standpoint of distribution of external force.

Moreover, another thin layer may be interposed inside the two-layer structure composed of the first layer 161 and the second layer 162, or, another thin layer may be disposed outside the two-layer structure composed of the first layer 161 and the second layer 162.

The following describes a method for manufacturing the laminated piezoelectric element 1 according to the present embodiment.

First, ceramic green sheets for forming the piezoelectric layers 11 are prepared. More specifically, calcined powder of piezoelectric ceramics, a binder made of an organic high polymer such as acrylic polymer or butyral polymer, and a plasticizer are mixed to prepare a slurry. Then, green sheets are formed from the slurry by a tape molding technique such as doctor blade method or calender roll method. As the piezoelectric ceramics, a material having piezoelectric properties such for example as a perovskite oxide made of lead zirconate titanate ($PbZrO_3$—$PbTiO_3$) can be used. Moreover, as the plasticizer, for example, dibutyl phthalate (DBP) or dioctyl phthalate (DOP) can be used.

Next, an electrically conductive paste for forming the internal electrode layers 12 is prepared. More specifically, the conductive paste is formed by admixing a binder and a plasticizer in metallic powder of a silver-palladium alloy. This conductive paste is applied, in a pattern of an internal electrode layer 12, onto the above-described green sheet by screen printing. Then, a plurality of green sheets with the printed conductive paste are laminated together, and, the laminate is subjected to binder removal treatment at a predetermined temperature, is fired at a temperature of 900° C. to 1200° C., and is ground into a predetermined shape by a surface grinder or otherwise, whereby the active section 13 in which piezoelectric layers 11 and internal electrode layers 12 are alternately laminated is produced. The inactive section 14 is formed of a laminate of sheets free of the conductive paste for forming the internal electrode layer 12. The active section 13 and the inactive section 14 are combined into the stacked body 10.

The way of producing the stacked body 10 is not limited to the manufacturing method as described above, and the stacked body 10 may therefore be produced by any given manufacturing method that enables production of the stacked body 10 comprising a laminate of a plurality of piezoelectric layers 11 and internal electrode layers 12.

Subsequently, the external electrode layer 15 is formed in thicknesses of 5 to 70 μm by baking a conductive paste containing metal such as Ag or Cu on a part of the side face of the stacked body 10 to which the end of one of opposite polarities of the internal electrode layers 12 is led. The external electrode layer 15 can be formed while being adjusted in thickness and width to predetermined values by the screen printing method or dispensing method.

Next, the cover layer 16 is produced by forming a cylindrical body from, for example, a nylon resin or a silicone resin to obtain the second layer 162, placing the laminated piezoelectric element 1 in the interior of the cylindrical body, pouring a liquid material such for example as a silicone resin into the gap between the laminated piezoelectric element and the cylindrical body, and thermally curing the silicone resin to form the first layer 161. In the alternative, the cover layer 16 may be produced by forming the first layer 161 first so that its outer surface has an annular sectional profile, and whereafter forming the second layer 162 around the first layer 161.

The creation of air gaps at the annular boundary, viz., the interface between the first layer 161 and the second layer 162 can be accomplished by, for example, imparting surface irregularities to any one of the layers, reducing the surface smoothness of the layer, or applying a coating of oil or the like to the layer.

Moreover, the creation of voids within the layer having an annular outer periphery, viz., the inner first layer 161 can be accomplished by, for example, blending atmosphere such as air into a resin for forming the first layer 161 before the resin is printed or charged into a mold. For example, the size of a void, the amount of voids, and the degree of void dispersion can be controlled by subjecting the resin to vacuum degassing for the release of gas from its interior in the curing process, and, in this case, by leaving the resin in a high vacuum condition during the early stage of curing, voids of smaller size can be created, and also the amount of voids can be reduced.

After that, a DC electric field of 0.1 to 3 kV/mm is applied to the external electrode layer 15 for polarization of the piezoelectric layers 11 constituting the stacked body 10, whereupon the laminated piezoelectric element 1 is completed. In the laminated piezoelectric element 1 in a condition of making connection with an external power supply via the external electrode layer 15, upon application of a voltage to the piezoelectric layers 11, each piezoelectric layer 11 undergoes great displacement under inverse piezoelectric effect. Thus, for example, the laminated piezoelectric element 1 can be operated as an automotive fuel injection valve for supplying a jet of fuel into an engine.

Figure 5:
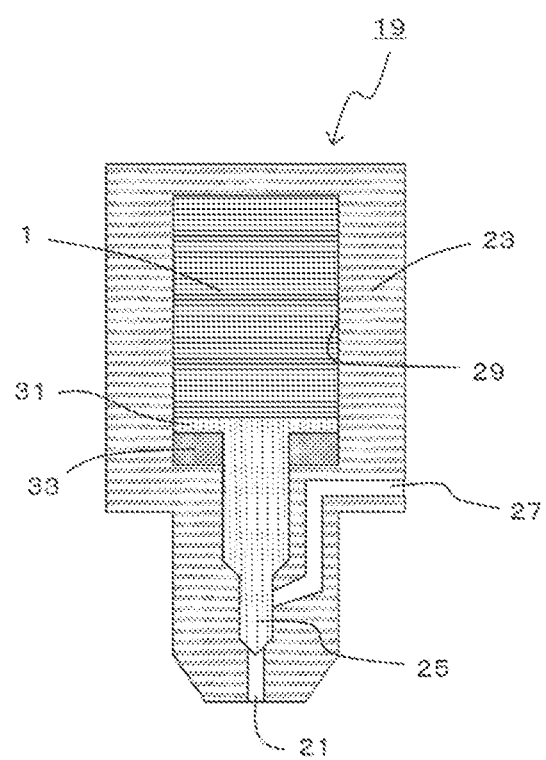
FIG. 5 is a schematic sectional view showing an example of an injection device in accordance with one embodiment of the invention.

The following describes an injection device in accordance with an embodiment of the invention. FIG. 5 is a schematic sectional view showing one embodiment of the injection device of the invention.

As shown in FIG. 5, the injection device 19 according to this embodiment is constructed by placing the exemplified laminated piezoelectric element 1 inside a container 23 provided with an injection hole 21 at one end thereof.

A needle valve 25 capable of opening and closing of the injection hole 21 is disposed inside the container 23. A fluid channel 27 is disposed for communication with the injection hole 21 in response to the movement of the needle valve 25. The fluid channel 27 is coupled to an external fluid supply source, so that a fluid is constantly fed to the fluid channel 27 under high pressure. Therefore, when the needle valve 25 is operated to open the injection hole 21, then the fluid present in the fluid channel 27 is injected to the outside or into an adjacent container, for example, a fuel chamber of an internal-combustion engine (not shown in the drawing).

The needle valve 25 has an upper end thereof having a large inside diameter to define a piston 31 which is slidably mounted in a cylinder 29 formed in the container 23. The exemplified laminated piezoelectric element 1 is accommodated in contact with the piston 31 inside the container 23.

In such an injection device 19, the injection hole 21 are opened and closed by driving the laminated piezoelectric element 1. More specifically, as the laminated piezoelectric element 1 undergoes expansion by the application of a voltage, the piston 31 is pressed correspondingly, thus causing the needle valve 25 to block the fluid channel 27 communicating with the injection hole 21 to stop fluid supply. Moreover, upon the interruption of voltage application, the laminated piezoelectric element 1 undergoes contraction, and a Belleville spring 33 pushes the piston 31 back, thus opening the fluid channel 27 for communication with the injection hole 21 to permit fluid injection from the injection hole 21.

The injection device 19 may be designed so that the fluid channel 27 is opened by applying a voltage to the laminated piezoelectric element 1, and that the fluid channel 27 is closed by stopping the voltage application.

Moreover, as long as the injection device 19 is designed so that the injection hole 21 are opened and closed by driving of the laminated piezoelectric element 1, the laminated piezoelectric element 1 does not necessarily have to be placed inside the container 23. In the injection device 19 according to this embodiment, the term "fluid" refers to, in addition to fuel and ink, various matters in liquid form such as a conductive paste and various matters in gaseous form. The use of the injection device 19 according to this embodiment makes it possible to control the flow rate of a fluid and the timing of fluid injection stably for a long period of time.

In the case of using the injection device 19 according to this embodiment provided with the exemplified laminated piezoelectric element 1 in an internal-combustion engine, as contrasted to the case of using a conventional injection device, it is possible to achieve injection of fuel into the combustion chamber of the internal-combustion engine such as an engine with high accuracy for a longer period of time.

Figure 6:
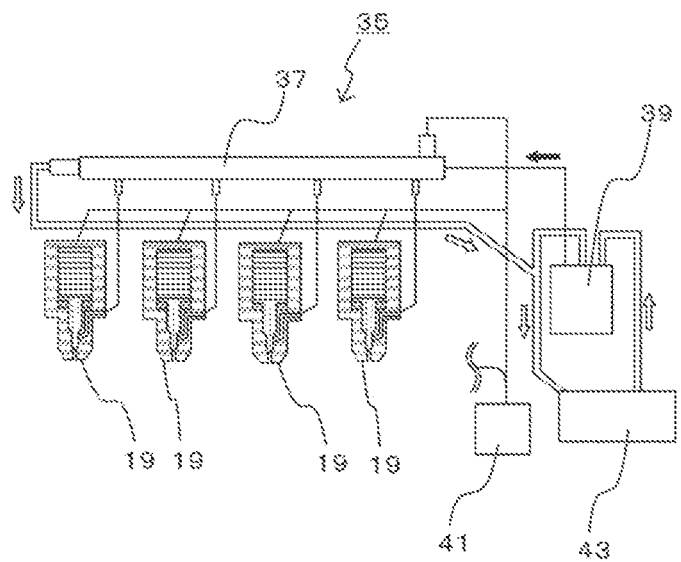
FIG. 6 is a schematic block diagram showing an example of a fuel injection system in accordance with one embodiment of the invention.

The following describes a fuel injection system in accordance with an embodiment of the invention. FIG. 6 is a schematic diagram showing an example of the fuel injection system in accordance with one embodiment of the invention.

As shown in FIG. 6, the fuel injection system 35 according to this embodiment comprises: a common rail 37 configured to store a high-pressure fuel which is a high-pressure fluid; a plurality of the exemplified injection devices 19 configured to inject the high-pressure fluid stored in the common rail 37; a pressure pump 39 configured to supply the high-pressure fluid to the common rail 37; and an injection control unit 41 configured to send driving signals to the injection devices 19.

The injection control unit 41 controls the amount of injection of the high-pressure fluid and injection timing on the basis of external information or external signals. For example, when using the fuel injection system 35 according to this embodiment for fuel injection for an engine, it is possible to control the amount of fuel injection and injection timing while detecting the conditions of the interior of the combustion chamber of the engine by a sensor or other means. The pressure pump 39 acts to supply the fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), or preferably a pressure of as high as about 1500 to 1700 atmospheres (about 152 MPa to about 172 MPa). The common rail 37 stores therein the high-pressure fuel fed from the pressure pump 39, and supplies it to the injection device 19 on an as needed basis. As described above, the injection device 19 injects a certain amount of fluid to the outside or into an adjacent container through the injection hole 21. For example, when a target of fuel supply by injection is an engine, the injection device 19 injects the high-pressure fuel in fine-spray form into the combustion chamber of the engine through the injection hole 21.

The fuel injection system 35 according to this embodiment is capable of effecting high-pressure fuel injection in a desired manner stably for a long period of time.

EXAMPLES

An actual implementation example of the invention will be described.

The laminated piezoelectric element according to the invention has been produced in the following manner. To begin with, a ceramic slurry was prepared by mixing calcined powder of piezoelectric ceramics composed predominantly of lead zirconate titanate ($PbZrO_3$—$PbTiO_3$) having an average particle size of 0.4 μm, a binder, and a plasticizer. The ceramic slurry was shaped into ceramic green sheets that constitute 50 μm-thick piezoelectric layers by the doctor blade method.

Next, a conductive paste for forming the internal electrode layers was prepared by adding a binder to a silver-palladium alloy.

Next, the conductive paste for forming the internal electrode layer was printed to one side of the ceramic green sheet by the screen printing method, and, 200 ceramic green sheets with the printed conductive paste were laminated on top of each other. Moreover, with the laminate of 200 ceramic green sheets having the printed conductive paste for forming the internal electrode layer set as a core, a laminate of 15 ceramic green sheets free of printed conductive paste for the internal electrode layer in total was placed on each of the top and the bottom of the core. The stacked body was fired at a temperature of 980° C. to 1100° C. and then ground into a predetermined shape by a surface grinder, whereupon a stacked body which is 5 mm per side was obtained.

Next, a Ag-containing conductive paste was applied to the surface of the stacked body by the screen printing method to form an external electrode layer.

As an example (Sample 1), a laminated piezoelectric element with a cover layer having a two-layer structure as shown in FIGS. 1A and 1B was produced. More specifically, a construction having a section as shown in FIG. 1B was produced by placing the thereby formed laminated piezoelectric element so as to lie on a center of the interior of a nylon resin-made cylindrical body which is 0.5 mm in thickness, 7.6 mm in inside diameter, 7.7 mm in outside diameter, and 27 mm in height, pouring a liquid raw material of silicone-made resin into the gap between the cylindrical body and the laminated piezoelectric element, and thermally curing the raw material at a temperature of 150° C. to form an internal silicone resin.

On the other hand, as a comparative example (Sample 2), a laminated piezoelectric element having a cover layer was produced. More specifically, a silicone resin has been applied in maximum thickness of about 1.0 mm to the entire area of the side of the laminated piezoelectric element by a brush-like tool, and then the resin was thermally cured at a temperature of 150° C.

In these laminated piezoelectric elements, a DC electric field of 3 kV/mm was applied to the external electrode layer via a lead member welded to the external electrode layer for 15 minutes to effect polarization. Upon application of a DC voltage of 160 V, each laminated piezoelectric element underwent a 30 μm-displacement in the stacking direction of the stacked body.

Moreover, as durability tests, the laminated piezoelectric elements was driven continuously with application of AC voltage in the range of 0 V to +160 V at a frequency of 150 Hz, at a temperature of 30° C., and at a humidity of 90%.

According to the test result, in the laminated piezoelectric element of Sample 2 produced as the comparative example, cracking occurred at the interface between the cover layer and the stacked body at the $1\times10^4$-th trial of continuous driving, thus uncovering the end of the internal electrode layer so as to be exposed to air, and the ensued electrical discharge caused a decrease in the amount of displacement.

On the other hand, the laminated piezoelectric element of Sample 1 produced as the example continued to operate without any change in displacement amount even after the $1\times10^7$-th trial of continuous driving. When dissolution of the silicone resin using a silicone remover (resin dissolvent) conducted after the driving, the surface of the stacked body showed no sign of electrical discharge at the internal electrode layer, and also no sign of cracking.

As will be seen from the above results, the invention succeeded in providing a laminated piezoelectric element having excellent long-term durability.

REFERENCE SIGNS LIST

1: Laminated piezoelectric element
10: Stacked body
11: Piezoelectric layer
12: Internal electrode layer
13: Active section
14: Inactive section
15: External electrode layer
16: Cover layer
161: First layer
162: Second layer
163: Air gap
164: Void

The invention claimed is:
1. A laminated piezoelectric element comprising:
a stacked body comprising an active section in which piezoelectric layers and internal electrode layers are alternately laminated, and inactive sections which are each made of the piezoelectric layer and are disposed at opposite ends of the active section in a stacking direction of the stacked body; and
a cover layer disposed so as to surround a side face of the stacked body,
the cover layer having a two-layer structure with an annular boundary when viewed in a section perpendicular to the stacking direction of the stacked body,
a plurality of air gaps being scattered along the annular boundary in the cover layer located on a side of each of the inactive sections and being dispersed in a circumferential direction.

2. The laminated piezoelectric element according to claim 1,
wherein the two-layer structure is composed of an inner first layer having an annular outer periphery and an outer second layer having an annular inner periphery, and
a void is present within the first layer.

3. The laminated piezoelectric element according to claim 2,
wherein the first layer is made of a silicone resin, and the second layer is made of a nylon resin.

4. The laminated piezoelectric element according to claim 1,
wherein the two-layer structure is composed of an inner first layer having an annular outer periphery and an outer second layer having an annular inner periphery, and
the first layer is smaller in elastic modulus than the second layer.

5. The laminated piezoelectric element according to claim 4,
wherein the first layer is made of a silicone resin, and the second layer is made of a nylon resin.

6. An injection device, comprising:
a container provided with an injection hole; and
the laminated piezoelectric element according to claim 1,
the injection hole being opened and closed by driving the laminated piezoelectric element.

7. A fuel injection system, comprising:
a common rail configured to store a high-pressure fuel;
the injection device according to claim 6, the injection device being configured to inject the high-pressure fuel stored in the common rail;
a pressure pump configured to supply the high-pressure fuel to the common rail; and
an injection control unit configured to send a driving signal to the injection device.

8. The laminated piezoelectric element according to claim 1,
wherein the plurality of air gaps are shaped so as to lie flat along a plane of an interface between the cover layer and the stacked body, and
the plurality of air gaps are dispersed in the stacking direction.

* * * * *